United States Patent
Itoh

(10) Patent No.: US 6,296,925 B1
(45) Date of Patent: *Oct. 2, 2001

(54) APERTURE FOR CHARGED BEAM DRAWING MACHINE AND METHOD FOR FORMING THE SAME

(75) Inventor: Katsuyuki Itoh, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/923,177

(22) Filed: Sep. 4, 1997

(30) Foreign Application Priority Data

Sep. 4, 1996 (JP) .................................................. 8-234517

(51) Int. Cl.$^7$ ................................. B32B 3/24; G03F 9/00
(52) U.S. Cl. ........................ 428/138; 428/131; 428/137; 430/5; 430/296
(58) Field of Search .................................. 428/131, 137, 428/138; 430/5, 296

(56) References Cited

U.S. PATENT DOCUMENTS

| | | | |
|---|---|---|---|
| 4,022,927 | * 5/1977 | Pfeiffer et al. ......................... | 427/43 |
| 5,593,761 | * 1/1997 | Itoh et al. .............................. | 428/210 |
| 5,728,492 | * 3/1998 | Kawata .................................... | 430/5 |
| 5,756,237 | * 5/1998 | Amemiya ................................ | 430/5 |
| 5,759,722 | * 6/1998 | Nozue ..................................... | 430/5 |
| 5,876,881 | * 3/1999 | Kawata .................................... | 430/5 |
| 5,942,760 | * 8/1999 | Thompson et al. ............... | 250/492.2 |
| 6,004,700 | * 12/1999 | Greschner et al. ...................... | 430/5 |

FOREIGN PATENT DOCUMENTS 8-195344   7/1996   (JP) .

OTHER PUBLICATIONS

Yoshinori Nakayama, et al., Highly Accurate Calibration Method of Electron–Beam Cell Projection Lithography, 1993, Proc. SPIE, vol. 1924, pp. 183–192.

Y. Someda, et al., Electron–Beam Cell Projection Lithography: Its Accuracy and Its Throughput, J. Vac. Sci. Technol. B 12(6) Nov./Dec. 1994, pp. 3399–3403.

* cited by examiner

Primary Examiner—William P. Watkins, III
(74) Attorney, Agent, or Firm—Hutchins, Wheeler & Dittmar

(57) ABSTRACT

An aperture plate for a charged beam drawing machine includes a body substrate having such a construction that opposite sides of a center plane in a thickness direction have the same structure. With this arrangement, it is possible to minimize a warp occurring in the course of forming the aperture plate, and therefore, the forming yield can be elevated.

8 Claims, 4 Drawing Sheets

APERTURE FOR CHARGED BEAM DRAWING MACHINE AND METHOD FOR FORMING THE SAME

BACKGROUND OF THE INVENTION

1. Field of the Invention

The present invention relates to an aperture for a charged beam drawing machine and a method for forming the same, in a method for drawing a plurality of patterns on a semiconductor substrate in bundle by a charged beam such an electron beam or an ion beam.

2. Description of Related Art

Recently, with advanced micro-fabrication of a semiconductor device, lithography is now changing from a light exposure to a charged beam drawing (exposure), in particular, an electron beam drawing.

However, the charged beam drawing has a problem that although a high degree of resolution can be obtained, a throughput is low. In order to solve this problem, a method called a "cell projection" or a "block exposure" has been proposed.

As one example of this method, there is a method for causing a charged beam to pass through a transfer aperture (transfer mask) formed with a desired pattern, to shape the beam into a desired pattern shape, which is projected onto a semiconductor wafer.

This technology is disclosed by for example Y. Nakayama et al. "Highly accurate calibration method of electron-beam cell projection lithography", Proc. SPIE, Vol. 1924 (1993) pp 183–192.

A substrate material for the transfer aperture plate used in this method is a material which has an effect for shielding electrons and which can be easily shaped. The substrate material used here is a Si (silicon) substrate or an SOI (silicon on insulator) substrate, Now, the transfer aperture plate in the prior art will be described with reference to FIGS. 1A to 1E.

First, as shown in FIG. 1A, on one principal surface (top surface) of a silicon substrate 31 having a thickness of 500 $\mu$m to 650 $\mu$m, a silicon oxide film 32 having a thickness of 1 $\mu$m is formed, and a silicon layer 33 having a thickness of 20 $\mu$m is formed on the silicon oxide film 32, so that a transfer mask substrate material 30 having the SOI structure as a whole is prepared. Here, the silicon oxide film 32 has an action as a bonding film for fixing the silicon layer 33 to the silicon substrate 31.

Then, a silicon oxide film 6 is deposited on a surface of the silicon layer 33, and after a resist layer is deposited, a resist pattern 7 is formed by means of a lithography.

Thereafter, as shown in FIG. 1B, the silicon oxide film 6 is patterned by a dry-etching using the resist pattern 7 as a mask, and then, the silicon layer 33 is patterned using the patterned silicon oxide film 6 as a mask. A pattern 33P of the silicon layer 33 thus patterned constitutes a transfer pattern of a transfer aperture.

In the prior art shown in FIGS. 1A to 1E, the thinned silicon oxide film 6 is removed after this step, but the silicon oxide film 6 may be left as it is.

Next, as shown in FIG. 1C, a silicon nitride film 8 is formed on the whole surface including a top surface, a bottom surface and a side surface. Thereafter, a silicon oxide film 9 having a thickness of about 0.1 $\mu$m is deposited on the silicon nitride film 8 at the bottom surface, and a resist pattern 11 is formed on the silicon oxide film 9.

Furthermore, as shown in FIG. 1D, the silicon oxide film 9 is patterned using the resist pattern 11 as a mask, and then, the silicon nitride film 8 is patterned using the patterned silicon oxide film 9, so that a pattern 8P of the silicon nitride film 8 remains.

Then, the silicon substrate 31 is etched back from the bottom surface by a KOH solution using the silicon nitride film pattern 8P as a mask, and furthermore, an exposed intermediate silicon oxide film 32 is removed by the etching.

Thereafter, as shown in FIG. 1E, the silicon nitride film pattern 8P is removed with a heated phosphoric acid. Thus, there is obtained the transfer aperture plate having the silicon layer 33 having the transfer pattern 33P and a peripheral portion supported by a support member 35 formed of the silicon substrate 31 and the silicon oxide film 32.

Here, the reason for using the silicon nitride film 8 is that the silicon nitride film is an extremely excellent film since it has a high resistive property to the KOH solution and since a film deposition and a film removal are easy. In addition, since this aperture plate is used for manufacturing a semiconductor device, it is advantageous from the viewpoints of TAT and the cost that it is formed in a semiconductor device production line. Therefore, it is also convenient to use the silicon nitride film which is well used in a semiconductor device production process.

However, there is a problem in depositing the silicon nitride film 8. A method for depositing the silicon nitride film by using a conventional semiconductor process uses a LPCVD (low pressure chemical vapor deposition) process, which however requires a condition that a temperature is as high as 700° C. to 800° C. and a $SiH_2Cl_2/NH_3$ gas is used at a flow rate ratio of about 1/10.

Since the film deposition rate is on the order of 0.7 to 3 nm/min., it is necessary to maintain the high temperature for a time of 35 to 140 minutes in order to obtain a film thickness on the order of 100 nm to 200 nm. Furthermore, adding a temperature rising time for elevating the temperature to the high temperature and a temperature dropping time for returning the temperature to a room temperature, the high temperature is maintained for 90 to 140 minutes.

The aperture plate for the charged beam drawing machine, as mentioned above with reference to FIGS. 1A to 1E, has a thin film region formed of the silicon layer 33, and a desired transfer pattern 33P is formed in this thin film region. In a process for forming the aperture plate for the charged beam drawing machine, when the silicon nitride film 8 is formed on the whole of the substrate (the whole of the wafer used as a material), since the film deposition is carried out in a high temperature condition, a warp occurs in the transfer aperture plate under influence of the intermediate silicon oxide film 32.

Namely, the silicon layer 33 having the film thickness of about 20 $\mu$m exists between the uppermost surface and the intermediate silicon oxide film 32, but the bottom surface side silicon substrate 31 is as very thick as 500 $\mu$m to 650 $\mu$m in comparison with the silicon layer 33. Observing the whole (in the sectional view), the intermediate silicon oxide film 32 is biased to the top surface side, so that a stress occurs, which warps the aperture plate (wafer). After the silicon nitride film 8 is uniformly deposited on the warped aperture plate (wafer), the aperture plate (wafer) is returned to the room temperature. As a result, when the respective films are apt to return their original conditions, namely, when the warp is apt to disappear, a crack occurs in the silicon nitride film 8 at the bottom surface side because of a difference in thermal reduction between the respective films If the crack occurs in the silicon nitride film, trash composed of silicon nitride is generated. In addition, if the crack has occurred in the silicon nitride film 8P shown in FIG. 1D, the bottom surface of the silicon substrate 31 as the support member becomes ragged with advancement of the etching using the KOH solution, and in this case, trash composed of silicon is also generated. In a patterning apparatus of not greater than 0.20 µm, generation of trash in an area of a deposition apparatus must be severely suppressed. Furthermore, since the bottom surface of the silicon substrate 31 as the support member becomes ragged, a close contact with a holder is lost, which becomes a cause of a positional deviation.

Here, there is a case that no crack occurs in the silicon nitride film, depending the film thickness of the silicon nitride film. Even in this case, however, the warp has occurred in the finally finished aperture plate for the charged beam drawing machine, which becomes a cause for a pattern variation.

SUMMARY OF THE INVENTION

Accordingly, it is an object of the present invention to reduce the warp in the process for forming an aperture plate for a charged beam drawing machine, by changing the structure of the material (wafer) for the aperture plate for the charged beam drawing machine, thereby to elevate the yield of production.

Another object of the present invention is to reduce the warp in the finished aperture plate for the charged beam drawing machine, so as to elevate a pattern transfer property, thereby to increase the yield of production, reliability and producibility of a semiconductor device.

According to one aspect of the present invention, there is provided an aperture plate for a charged beam drawing machine, configured to allow a charged beam to pass through an aperture to transfer a pattern formed in the aperture plate onto a semiconductor substrate, wherein a body of the aperture plate has such a construction that opposite sides of a center plane in a thickness direction have the same structure Alternatively, the aperture plate for a charged beam drawing machine, configured to allow the charged beam to pass through the aperture to transfer the pattern formed in the aperture plate onto a semiconductor substrate, has an aperture plate body so constructed that influences caused for a high temperature heat processing at opposite sides of a center plane in a thickness direction are canceled to each other, whereby the occurrence of the warp in the high temperature heat processing is minimized.

According to another aspect of the present invention, there is provided a method for forming an aperture plate for a charged beam drawing machine, configured to allow a charged beam to pass through an aperture to transfer a pattern formed in the aperture plate onto a semiconductor substrate, the method comprising the steps of preparing a body substrate having such a construction that opposite sides of a center plane in a thickness direction have the same structure, forming a pattern to be transferred on a semiconductor substrate, on one surface of the body substrate, depositing a silicon nitride film on the whole surface of the body material, patterning the silicon nitride film to form a mask formed of the silicon nitride film, on a selected portion of the other surface of the body substrate, and etching-removing the body substrate from the other surface side of the body substrate using the patterned silicon nitride film as a mask, so as to form a support member for supporting the pattern.

In the above mentioned aperture plate for the charged beam drawing machine, and in the above mentioned method for forming the aperture plate, the body substrate can be constructed of a silicon substrate, preferably a silicon substrate in the form of a silicon wafer, intermediate layers formed on opposite surfaces of the silicon substrate, respectively, and silicon layers formed on the intermediate layers, respectively. In this case, preferably, the two silicon layers have the same thickness, and the intermediate layers have the same thickness. Generally, the intermediate layers are formed of a silicon oxide film. However, the intermediate layers can be formed of a silicon nitride film having a thickness smaller than that of a silicon nitride film which becomes a mask at the time of forming a support member.

In the above mentioned aperture plate for the charged beam drawing machine, since a top surface side and a bottom surface side have the same structure, when a silicon nitride film is deposited on the whole at a high temperature, no warp occurs, and after the silicon nitride film is uniformly deposited, when the aperture plate is returned to a room temperature, no warp occurs as a matter of course.

DESCRIPTION OF THE PREFERRED EMBODIMENTS

Now, the present invention will be described with reference to the accompanying drawings.

Figure 1A:
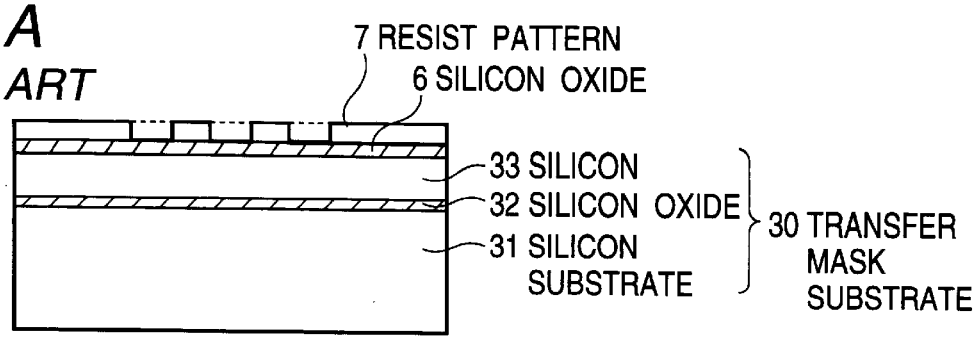
FIGS. 1A, 1B, 1C, 1D and 1E are diagrammatic sectional views illustrating the process for forming the prior art aperture plate for the charged beam drawing machine.
Figure 1B:
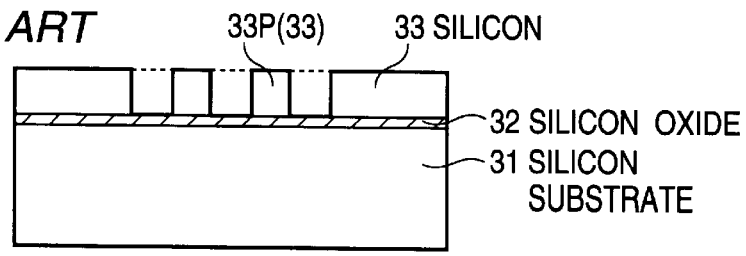
Figure 1C:
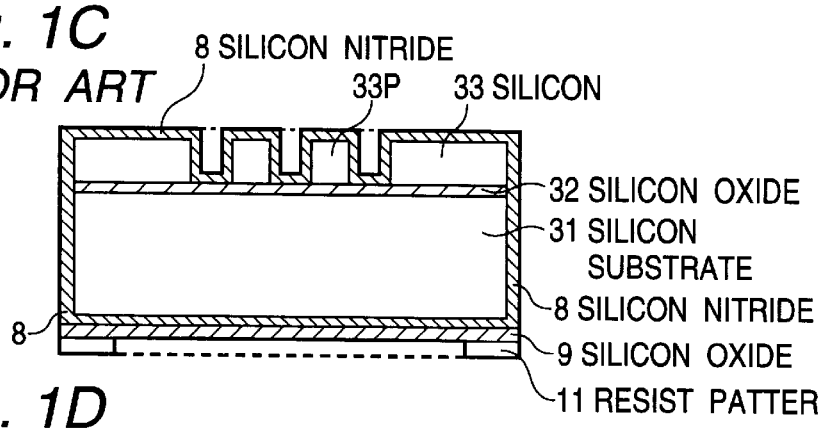
Figure 1D:
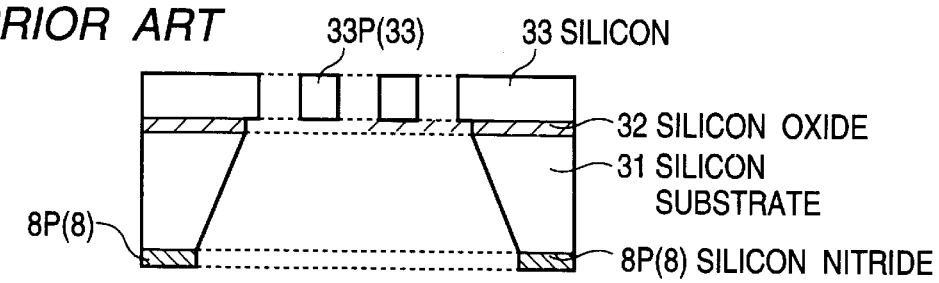
Figure 1E:
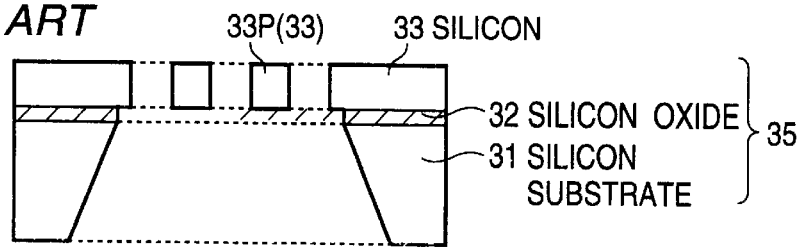
Figure 2:
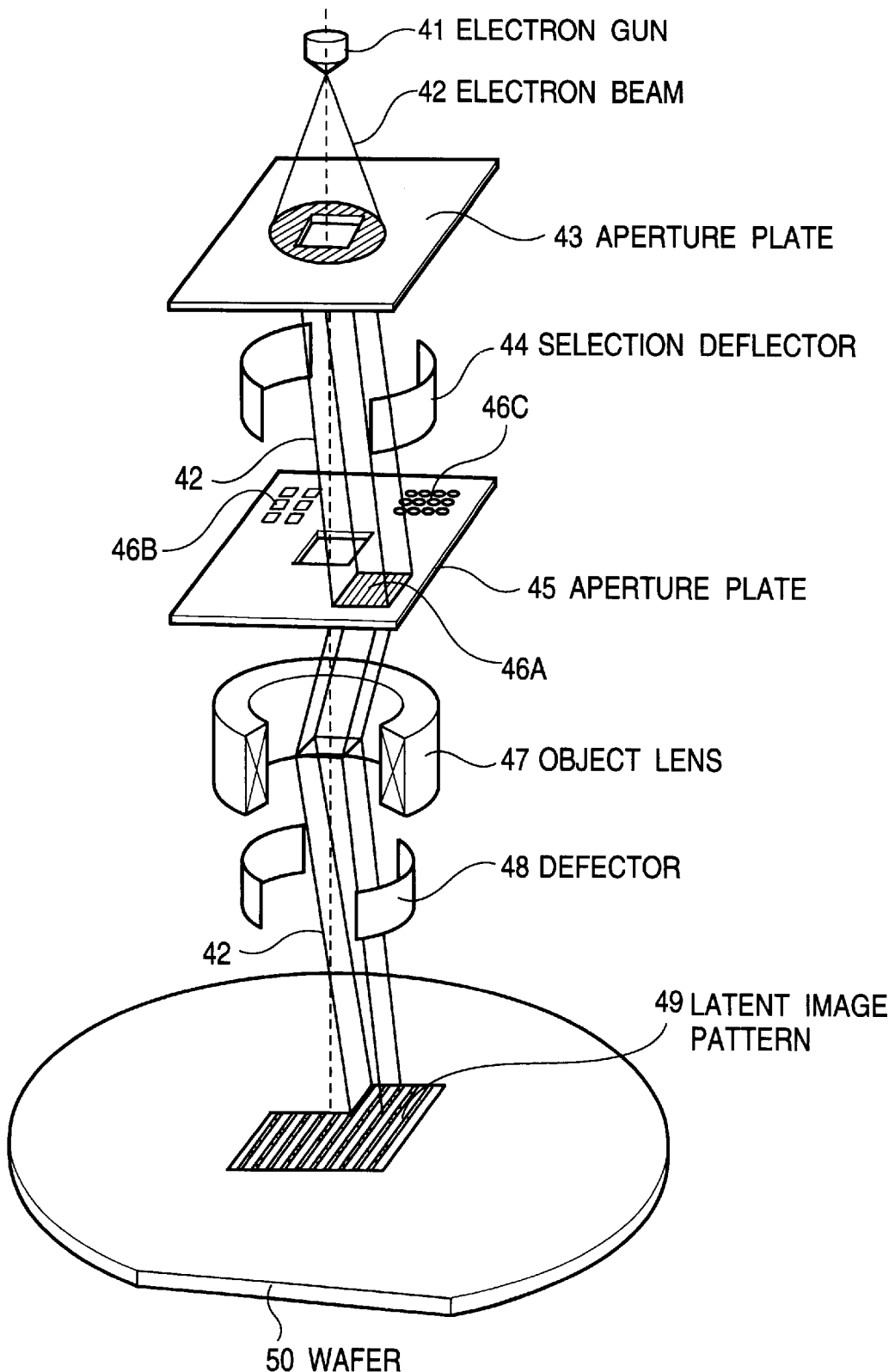
FIG. 2 illustrates a diagrammatic construction of the charged beam drawing machine using the aperture plate in accordance with the present invention for the charged beam drawing machine.

FIG. 2 illustrates a diagrammatic construction of the charged beam drawing machine using the aperture plate in accordance with the present invention for the charged beam drawing machine. An electron beam 42 emitted from an electron gun 41 passes through a first shaping aperture plate 43, a selection deflector 44, a second shaping aperture plate 45, an object lens, and a deflector 48, so that the electron beam is irradiated onto a resist film on a semiconductor wafer 50 so as to draw a predetermined latent image pattern in the resist film.

The second shaping aperture plate 45 is formed with a plurality of different aperture patterns 46A, 46B, 46C, . . . . For example, the aperture pattern 46A is formed of a plurality of linear openings, and the aperture pattern 46B is formed of a plurality of rectangular openings. The aperture pattern 46B is formed of a plurality of circular openings. The electron beam 42 is caused to pass through the aperture pattern (the aperture pattern 46A in the drawing) selected by the selection deflector 44, and the aperture pattern is reduced by the object lens 47, so that the latent image pattern 49 is formed in the resist film on the semiconductor wafer 50 For example, the reduction ratio is 1:25. A machine having the reduction ratio of 1:80 or 1:100 has been developed. Even in the machine having the reduction ratio of 1:25, a resist pattern obtained by developing the latent image pattern 49 can have the resolution of not greater than 0.16 µm. The aperture plate in accordance with the present invention for the charged beam drawing machine can be applied to each of the aperture patterns shown in FIG. 2, but also can be applied to an aperture plate having a plurality of aperture patterns.

Now, an embodiment of the aperture plate in accordance with the present invention for the charged beam drawing machine, and a method in accordance with the present invention for forming the aperture plate, will be described with reference to FIGS. 3A to 3F.

Figure 3A:
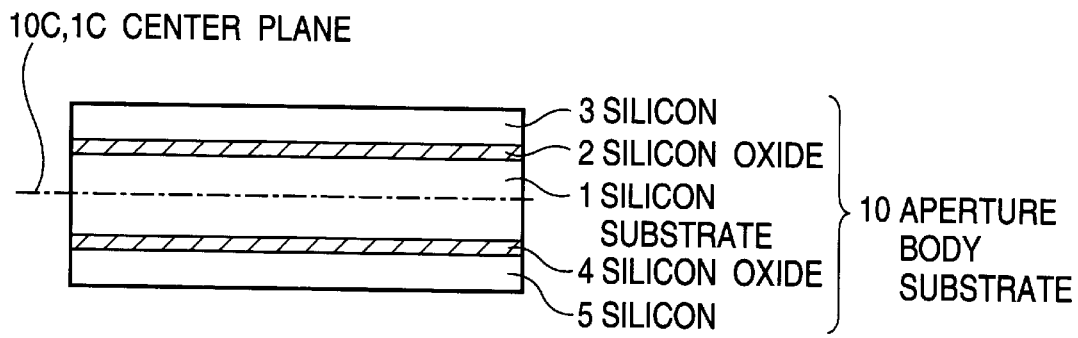
FIGS. 3A, 3B, 3C, 3D, 3E and 3F are diagrammatic sectional views illustrating an embodiment of the process in accordance with the present invention for forming the aperture plate for the charged beam drawing machine.

First, as shown in FIG. 3A, on one principal surface (top surface) of a silicon substrate 1 having a thickness of 500 µm to 650 µm, a silicon oxide film 2 having a thickness of 1 µm is formed, and a silicon layer 3 having a thickness of 20 µm is formed on the silicon oxide film 2. Similarly, on the other principal surface (bottom surface) of a silicon substrate 1, a silicon oxide film 4 having a thickness of 1 µm is formed, and a silicon layer 5 having a thickness of 20 µm is formed on the silicon oxide film 4. The whole constitutes a body substrate 10 for the aperture plate.

Accordingly, the SOI type body substrate 10 thus formed has such a construction that both sides (an upper side and a lower side in the drawing) of a center plane 10C of the body substrate 10 in a thickness direction, namely of a center plane 1C of the silicon substrate 1 in a thickness direction, have the same structure.

The silicon oxide films 2 and 4, which are an intermediate layer, are formed of a film of silicon dioxide expressed by $SiO_2$, and function as an adhesive film for bonding the silicon layers 3 and 5 to the silicon substrate 1. The silicon layers 3 and 5 having the thickness of 20 µm can be formed by sticking a silicon plate on the silicon substrate and by grinding the silicon plate. However, the silicon layers 3 and 5 can also be formed by growing a silicon film on the silicon oxide films 2 and 4.

Figure 3B:
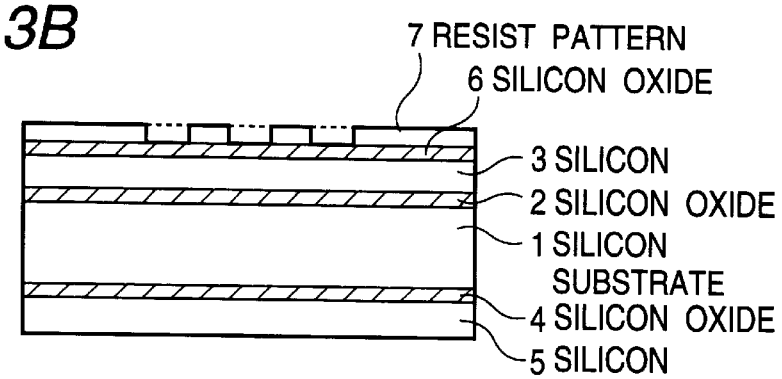

Thereafter, as shown in FIG. 3B, a silicon oxide film 6 is deposited on a surface of the silicon layer 3, and a resist film is deposited, and then, patterned by a lithography to form a resist pattern 7.

Figure 3C:
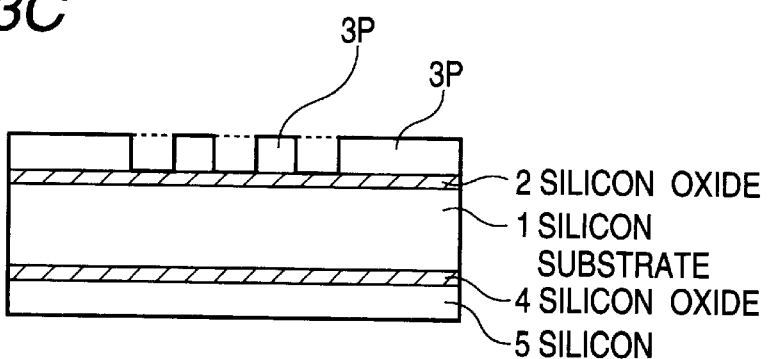

Then, as shown in FIG. 3C, the silicon oxide film 6 is patterned by a dry etching using the resist pattern 7 as a mask, and furthermore, the silicon layer 3 is patterned using the patterned silicon oxide film 6 as a mask. A pattern 3P thus formed in the silicon layer 3 constitutes a transfer pattern of a transfer aperture.

Figure 3D:
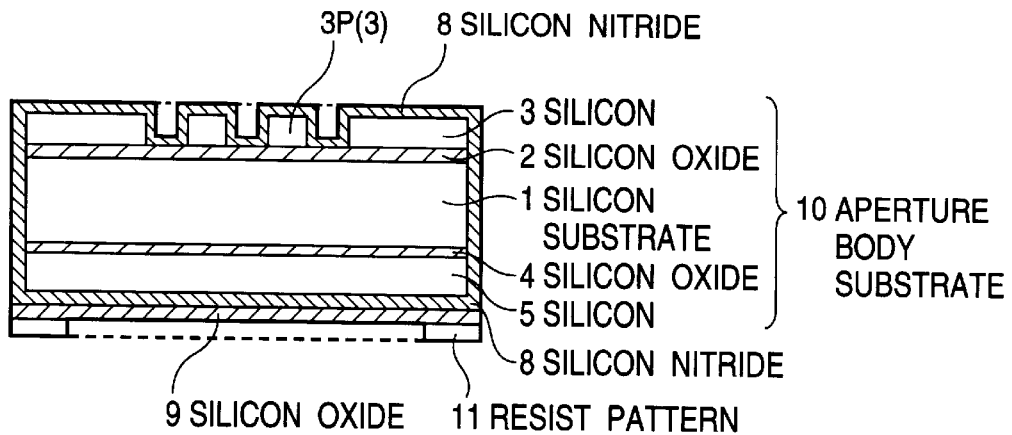

Thereafter, as shown in FIG. 3D, a film 8 of silicon nitride ($Si_xN_y$, for example, $Si_3N_4$) is formed to cover the whole surface including a top surface (an upper side in the drawing), a bottom surface (a lower side in the drawing), and a side surface. As mentioned hereinbefore, when the silicon nitride film 8 is formed, a high temperature heat processing (heat processing of not less than 600° C.) is conducted. Then, a silicon oxide film 9 having a film thickness of about 0.1 µm is deposited on the silicon nitride film 8 at the bottom surface side, and a resist film is deposited and then patterned by a lithography to form a resist pattern 11.

Figure 3E:
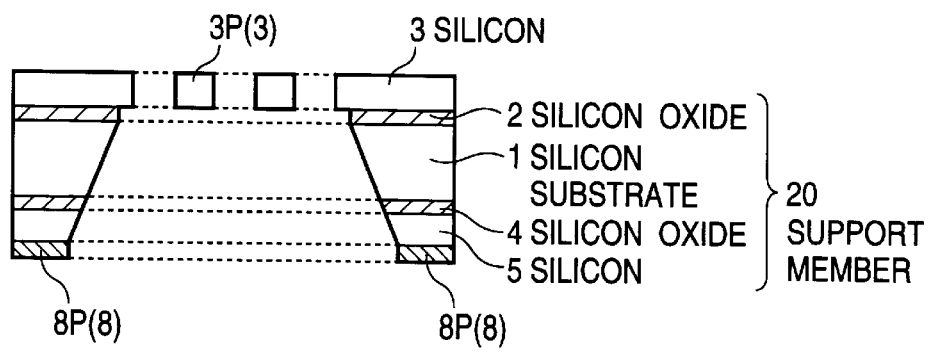

As shown in FIG. 3E, the silicon oxide film 9 is patterned using the resist pattern 11 as a mask, and the silicon nitride film 8 is patterned using the patterned silicon oxide film 9 as a mask, so that there is formed a pattern 8P of the silicon nitride film 8 covering only a periphery of the bottom surface.

By using the silicon nitride film pattern 8P as a mask, the silicon layer 5 and the silicon substrate 1 is etched back from the bottom surface by a KOH solution. The intermediate silicon oxide films 4 and 2 exposed in the course of this etching-back process and at the final stage of the etching-back process, are etch-removed by that etching solution.

Figure 3F:
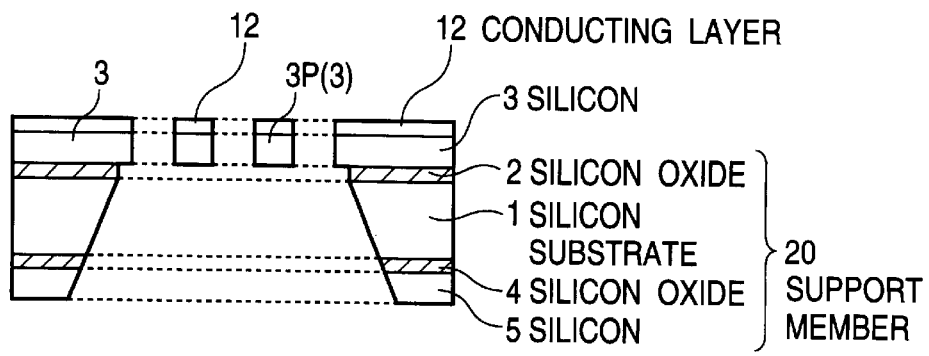

Therefore, as shown in FIG. 3F, the silicon nitride film pattern 8P is removed by a heated phosphoric acid. Thus, there is obtained the aperture plate in accordance with the embodiment of the present invention for the charged beam drawing machine in which a periphery of the silicon layer 3 having the transfer pattern 3P is supported by a support member 20 constituted of the silicon substrate 1, the silicon layer 5, and the silicon oxide films 2 and 4, and an upper surface of the silicon layer 3 is formed with a conducting layer 12 formed of an Au, Pt or Pt-Pd film having the film thickness of 0.25 µm to 1 µm. Incidentally, the shielding for a selected portion of the electron beam can be realized with the silicon layer 3 having the thickness of 20 µm, and the conducting layer 12 is provided for preventing the charge-up of the aperture plate itself. The aperture plate is used in such a manner that the top surface and the bottom surface of the aperture plate are electrically connected to a holder made of metal.

In the above mentioned forming process, when the silicon nitride film 8 is deposited on the whole (the whole of the wafer in which the aperture is formed), the film deposition is carried out in a high temperature condition. At this time, since the intermediate silicon oxide film 2 having the film thickness of 1 µm exists at a position of 20 µm inward from the top surface, and since the intermediate silicon oxide film 4 having the film thickness of 1 µm exists at a position of 20 µm inward from the bottom surface, similarly to the top surface side, the structure is symmetrical in a thickness direction.

Accordingly, in an intermediate step, even if the aperture plate is put in the high temperature condition, a stress occurring at the top surface side is the same as a stress occurring at the bottom surface side, so that no warp occurs. Therefore, it is possible to form a highly precise pattern. In addition, as a result, no crack occurs in the silicon nitride film 8 in the process for forming the aperture plate for the charged beam drawing machine.

In the above mentioned embodiment, the intermediate layers are formed of the silicon oxide films 2 and 4 However, since it is sufficient if the top side and the lower side are formed of the same material and the structure is symmetrical in a thickness direction, the intermediate layers can be formed of another material, for example, a silicon nitride film. In this case, it is required that the total thickness of the film thickness of two intermediate silicon nitride films is smaller than the film thickness of the silicon nitride film 8 used as the etching mask, so that the etching mask pattern 8P of the silicon nitride film will remain until the etching for shaping the support member in the step shown in FIG. 3E is completed.

Furthermore, even when the top surface side intermediate layer and the bottom surface side intermediate layer are formed of different materials, if the respective thickness of the top surface side intermediate layer and the bottom surface side intermediate layer are made different from each other to balance a top surface side stress and a bottom surface side stress against to each other in a high temperature heat processing, so that influence of the high temperature heat processing at opposite sides of the center plane in the thickness direction are canceled by each other, with the result that it is possible to obtain an aperture plate for a charged beam drawing machine in which generation of a warp has been minimized.

As mentioned above, since the aperture plate in accordance with the present invention for a charged beam drawing machine is characterized in that a top surface side and a bottom surface side have the same structure, when a silicon nitride film is deposited on the whole at a high temperature in the course of forming the aperture plate, no warp occurs in the aperture plate, and after the silicon nitride film is uniformly deposited on the aperture plate, when the aperture plate is returned to a room temperature, no warp occurs as a matter of course. In addition, there occurs no inconvenience caused by generation of a crack in the silicon nitride film.

Accordingly, the yield of production of the aperture plate for the charged beam drawing machine is elevated. Since the aperture pattern deformation caused by the influence of the stress is greatly reduced even in the finished aperture plate for the charged beam drawing machine, the accuracy in size of a pattern drawn on a wafer by using this aperture plate is elevated, and therefore, the yield of production and the reliability of a semiconductor device are improved. A total producibility can be increased, and the cost can be reduced.

What is claimed is:

1. An aperture plate for a charged beam drawing machine, configured to allow a charged beam to pass through an aperture in a multilayered plate to transfer a pattern formed in a first surface of the aperture plate onto a semiconductor substrate, wherein a body of said aperture plate has such a construction that opposite sides of a center plane in a thickness direction in an unpatterned portion of the aperture plate have the same structure;

wherein said body of said aperture plate includes a silicon substrate as the center plane, intermediate layers formed on opposite surfaces of said silicon substrate, respectively, and silicon layers formed on said intermediate layers, respectively.

2. The aperture plate for a charged beam drawing machine, as claimed in claim 1 wherein said silicon layers have the same thickness as each other, and said intermediate layers have the same thickness as each other.

3. The aperture plate for a charged beam drawing machine, as claimed in claim 1 wherein said intermediate layers are formed of a silicon oxide film.

4. The aperture plate for a charged beam drawing machine, as claimed in claim 1 wherein said intermediate layers are formed of a silicon nitride film.

5. An aperture plate for a charged beam drawing machine, comprising:

a substantially flat substrate having a first surface and a second surface;

a first outer layer having a first thickness and a first composition attached to the first surface;

a second outer layer having a second thickness and a second composition attached to the second surface;

a transfer pattern having a known area formed by removing portions of the first outer layer;

the portion of the substrate and second outer layer in the known area removed; and wherein further the first and second outer layers have the same composition and thickness.

6. The aperture plate of claim 5, wherein further the first and second outer layers are attached to the substantially flat substrate by first and second bonding layers respectively.

7. The aperture plate of claim 6, wherein further the first and second bonding layers have approximately the same composition and thickness.

8. The aperture plate of claim 6, wherein further the first and second bonding layers have approximately the same coefficient of thermal expansion.

* * * * *